United States Patent
Funaki et al.

(10) Patent No.: US 9,945,962 B2
(45) Date of Patent: Apr. 17, 2018

(54) SIGNAL PROCESSOR AND RADIATION DETECTION DEVICE

(71) Applicant: Kabushiki Kaisha Toshiba, Minato-ku (JP)

(72) Inventors: Hideyuki Funaki, Shinagawa (JP); Shunsuke Kimura, Kawasaki (JP); Go Kawata, Kawasaki (JP); Tetsuro Itakura, Nerima (JP); Masanori Furuta, Odawara (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/259,835

(22) Filed: Sep. 8, 2016

(65) Prior Publication Data
US 2016/0377741 A1  Dec. 29, 2016

Related U.S. Application Data

(63) Continuation of application No. PCT/JP2014/084414, filed on Dec. 25, 2014.

(30) Foreign Application Priority Data

Mar. 20, 2014  (JP) .................. 2014-059099

(51) Int. Cl.
*G01T 1/20* (2006.01)
*G01T 1/17* (2006.01)
*G01R 19/175* (2006.01)

(52) U.S. Cl.
CPC .......... *G01T 1/2018* (2013.01); *G01R 19/175* (2013.01); *G01T 1/17* (2013.01); *G01T 1/171* (2013.01)

(58) Field of Classification Search
CPC .................................................. G01T 1/171
See application file for complete search history.

(56) References Cited

U.S. PATENT DOCUMENTS 4,692,890 A * 9/1987 Arseneau .......... G01T 1/1642
327/339
5,210,423 A  5/1993 Arseneau
(Continued)

FOREIGN PATENT DOCUMENTS

JP  50-1619 B1  1/1975
JP  62-115191 U  7/1987
(Continued)

OTHER PUBLICATIONS

International Search Report and Written Opinion dated Apr. 7, 2015 in PCT/JP2014/084414 (with English translation).

*Primary Examiner* — Kenneth J Malkowski
(74) *Attorney, Agent, or Firm* — Oblon, McClelland, Maier & Neustadt, L.L.P.

(57) ABSTRACT

According to an embodiment, a signal processor includes an integrator, a differentiator, a zero cross detector, a pile-up detector, an event interval detector, a counter, and a creator. The integrator is configured to calculate charge of current from a photoelectric converter for an incident radiation. The differentiator is configured to calculate a differential value of the current. The zero cross detector is configured to detect a zero cross of the differential value. The pile-up detector is configured to detect pile-up of the current based on the zero cross. The event interval detector is configured to detect, based on the zero cross and pile-up, an event interval of the radiation entering. The counter is configured to count, based on the charge and pile-up, the respective numbers of events according to the charge and the event interval. The creator is configured to create histograms for the numbers of events.

3 Claims, 8 Drawing Sheets

(56) References Cited

U.S. PATENT DOCUMENTS

| | | | |
|---|---|---|---|
| 6,392,236 B1 | 5/2002 | Maekawa et al. | |
| 2004/0036025 A1* | 2/2004 | Wong | G01T 1/1642 |
| | | | 250/363.09 |
| 2010/0193700 A1 | 8/2010 | Herrmann et al. | |
| 2012/0298875 A1* | 11/2012 | Ueno | G01T 1/17 |
| | | | 250/362 |
| 2015/0084802 A1 | 5/2015 | Kimura et al. | |
| 2015/0085985 A1 | 5/2015 | Funaki et al. | |
| 2015/0130538 A1 | 5/2015 | Itakura et al. | |
| 2015/0137858 A1 | 5/2015 | Itakura et al. | |
| 2015/0160677 A1 | 6/2015 | Furuta et al. | |
| 2016/0313459 A1* | 10/2016 | Scoullar | G01T 1/366 |

FOREIGN PATENT DOCUMENTS

| | | |
|---|---|---|
| JP | 3-123881 A | 5/1991 |
| JP | 3-135785 A | 6/1991 |
| JP | 3-218489 A | 9/1991 |
| JP | 2001-42043 A | 2/2001 |
| JP | 2002-94379 A | 3/2002 |
| JP | 2003-43149 A | 2/2003 |
| JP | 2004-023750 A | 1/2004 |
| JP | 2004-112077 A | 4/2004 |
| JP | 2006-78235 A | 3/2006 |
| JP | 2007-327902 A | 12/2007 |
| JP | 2012-233727 A | 11/2012 |
| JP | 2013-140160 A | 7/2013 |
| JP | 2015-65531 A | 4/2015 |
| JP | 2015-65532 A | 4/2015 |
| JP | 2015-95830 A | 5/2015 |
| JP | 2015-100036 A | 5/2015 |
| JP | 2015-115654 A | 6/2015 |

* cited by examiner

SIGNAL PROCESSOR AND RADIATION
DETECTION DEVICE

CROSS-REFERENCE TO RELATED
APPLICATIONS

This application is a continuation of PCT international Application Ser. No. PCT/JP2014/084414, filed on Dec. 25, 2014, which designates the United States; the entire contents of which are incorporated herein by reference.

FIELD

An embodiment of the present invention relates to a signal processor and a radiation detection device.

BACKGROUND

Recently, a silicon-based photomultiplier is actively developed, and also a weak light detection system using a scintillator and a photomultiplier (such as a radiation detection device adapted to detect an X-ray and the like) is further along in development. For example, the radiation detection device is utilized in computed tomography (CT) and the like and enables tomography of a patient, a luggage, or the like. Especially, as a photoelectric conversion element to be a detection unit of the photomultiplier, a SiPM formed by connecting, in series, an avalanche photodiode (APD) and a quench resistor has a high S/N ratio and a high dynamic range and achieves low-voltage drive. Such a radiation detection device utilizing the photoelectric conversion element detects current from the photoelectric conversion element, and acquires charge and voltage by integrating the current, and then the voltage (charge) is sampled and held to be subjected to AD conversion. An obtained digital signal is utilized to create a histogram and the like by signal processing.

On the other hand, in a radiation detection device of a photon counting system, an arrival rate of an X-ray entering an scintillator is estimated to be about $10^8$ [cps], and a circuit that can measure data with high-speed and high-energy resolution by several hundreds of channels is demanded. Furthermore, a counting rate that can be detected by the above-described radiation detection device is varied by a recovery time of the photoelectric conversion element, conversion capacity of an AD converter, or the like. However, in order to shorten the recovery time of the photoelectric conversion element, there may be an exemplary method of reducing a time constant by setting a small value for a quench resistor of the photoelectric conversion. However, in the case where the value of the quench resistor is too small, quenching operation may not be able to be performed. Therefore, shortening the recovery time has a limit. Due to this, a so-called pile-up may occur when a phenomenon (hereinafter referred to as event") in which a photon of radiation (or scintillation light converted by scintillator) enters the photoelectric conversion element occurs within the recovery time of the photoelectric conversion element.

Furthermore, a probability of event occurrence occurring in the radiation detection device is based on Poisson distribution. Therefore, in the case where an event interval is, for example, an interval shorter than an average arrival time 10 [ns] (equivalent to $10^8$ [cps] described above) of the radiation, the probability of event occurrence is about six out of ten, and even in the case of 4 [ns] or less, the probability of event occurrence is about three out of ten. Therefore, the AD converter having high-speed AD conversion capacity is necessary in order to detect an event, but the high-speed AD converter consumes a large amount of electricity.

DETAILED DESCRIPTION

According to an embodiment, a signal processor includes an integrator, a differentiator, a zero cross detector, a pile-up detector, an event interval detector, a counter, and a creator. The integrator is configured to calculate charge by integrating current from a photoelectric converter that converts to the current based on an incident radiation. The differentiator is configured to calculate a differential value by differentiating the current. The zero cross detector is configured to detect a zero cross of the differential value. The pile-up detector is configured to detect pile-up relative to the current based on the zero cross. The event interval detector is configured to detect, based on the zero cross and the pile-up, an event interval that is a time period between events in which the radiation enters the photoelectric converter. The counter is configured to count, based on the charge and the pile-up, number of events according to the charge, and number of events according to the event interval. The creator is configured to create a histogram for the number of events relative to the charge, and a histogram of the number of events relative to the event interval.

In the following, a signal processor and a radiation detection device according to an embodiment of the present invention will be described in detail with reference to the drawings. Furthermore, note that a same portion is denoted by a same reference sign in the following drawings. However, since the drawings are schematically illustrated, a specific configuration should be determined in consideration of the following description.

Figure 1:
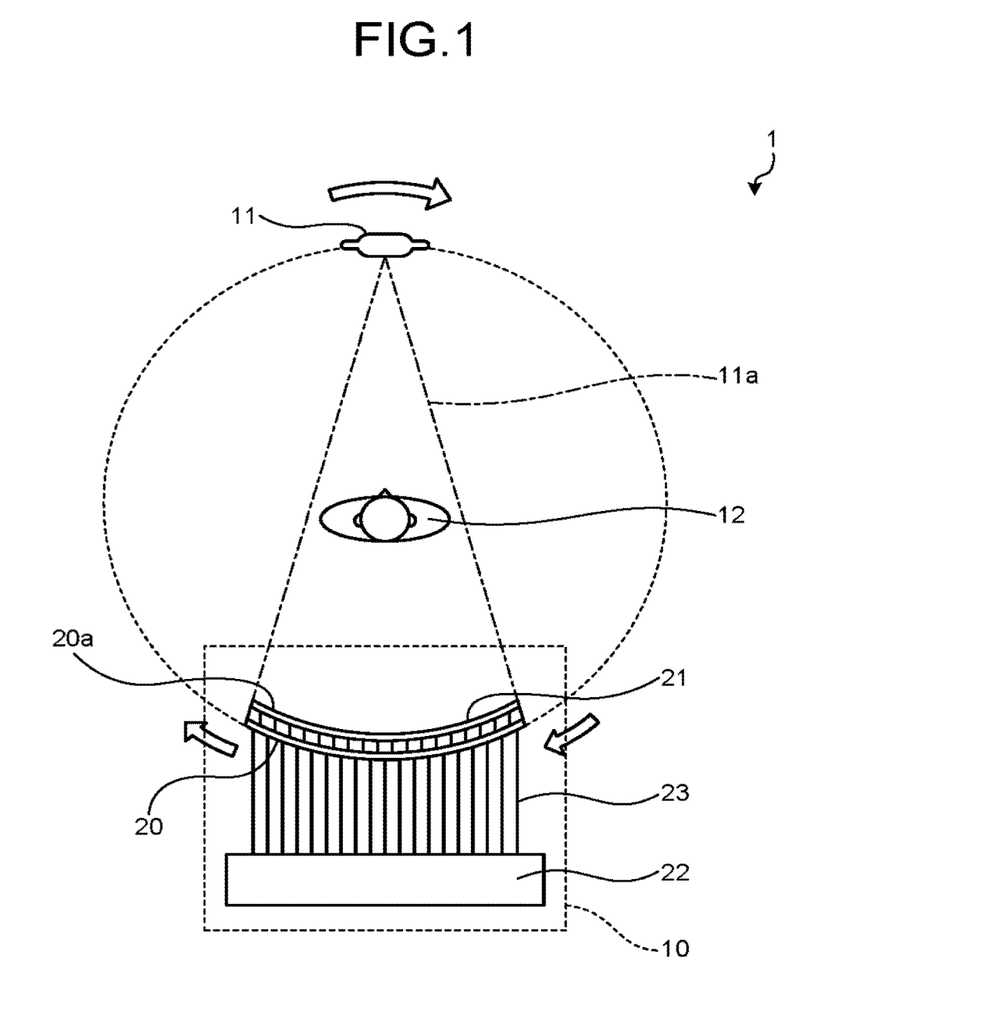
FIG. 1 is a diagram illustrating an exemplary structure of a radiation examination device.

FIG. 1 is a diagram illustrating an exemplary structure of a radiation examination device. An entire structure of the radiation examination device 1 will be described with reference to FIG. 1.

As illustrated in FIG. 1, the radiation examination device 1 includes: a radiation tube 11; and a radiation detection device 10 provided in a manner facing the radiation tube 11.

The radiation tube 11 is a device to irradiate the facing radiation detection device 10 with a radiation beam 11a such as an X-ray in a fan-like form. The radiation beam 11a emitted from the radiation tube 11 transmits a test object 12 on a gantry not illustrated, and enters the radiation detection device 10.

The radiation detection device 10 is irradiated by the radiation tube 11, and at least a part thereof receives the radiation beam 11a that at least partly transmits the test object 12 on an incident surface 20a, and converts the radiation beam to scintillation light including at least part of ultraviolet, visible light, and infrared of the radiation, and then detects the scintillation light as an electrical signal. The radiation detection device 10 includes: a plurality of radiation detecting units 20 arrayed in a substantially arc shape; a collimator 21 mounted on the incident surface 20a side of the radiation detecting unit 20, and a signal processor 22 connected to an electrode on an opposite side of the radiation tube 11 side of each of the radiation detecting units 20 via a signal line 23.

The radiation detecting unit 20 converts the radiation (radiation beam 11a) entering the incident surface 20a to scintillation light, and the scintillation light is converted to an electrical signal (current) by a later-described photoelectric conversion element 32 (photoelectric conversion).

The collimator 21 is an optical system mounted on the incident surface 20a side of the radiation detecting unit 20 and adapted to refract the radiation such that the radiation parallelly enters the radiation detecting unit 20.

The signal processor 22 receives the electrical signal (current) photoelectrically converted by each of the radiation detecting units 20 via the signal line 23, thereby detecting an event and calculating energy of the radiation entering each of the radiation detecting units 20 from a received current value.

Then, the radiation tube 11 and the radiation detection device 10 are arranged so as to be rotated around the above-described test object 12. Thus, the radiation examination device 1 can generate a cross-sectional image of the test object 12. Meanwhile, the radiation examination device 1 including the radiation detection device 10 can be applied to not only tomogram images of human bodies, animals, and plants but also various kinds of examination devices such as a security device which performs fluoroscopy for inside of an article, and the like.

Figure 2A:
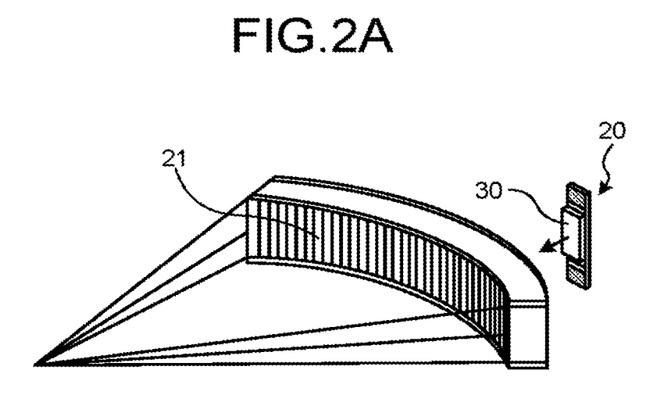
FIGS. 2A and 2B are diagrams illustrating an exemplary structure of a radiation detector.
Figure 2B:
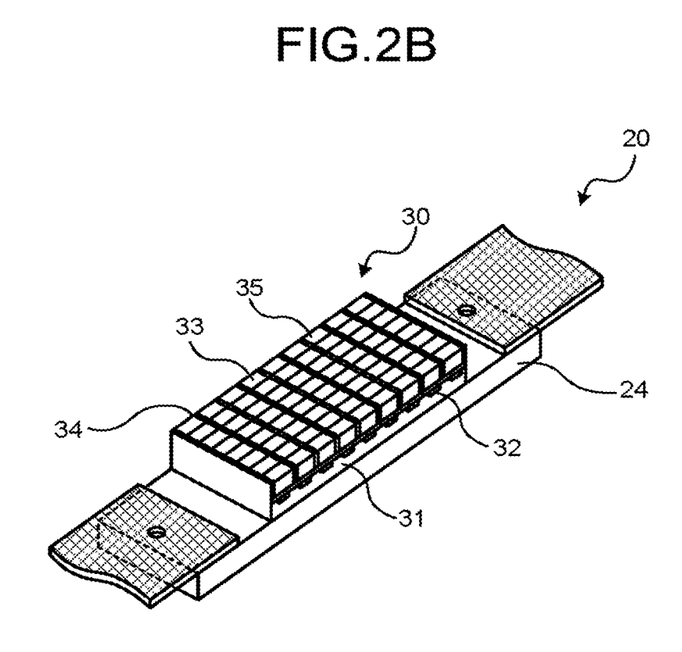

FIGS. 2A and 2B are diagrams illustrating an exemplary structure of a radiation detector. Structures of the radiation detecting unit 20 and radiation detector 30 will be described with reference to FIGS. 2A and 2B. FIG. 2A is a structural diagram of a plurality of radiation detecting units 20 arrayed in the substantially arc shape, and FIG. 2B is a schematic structural diagram of the radiation detector 30 included in the radiation detecting unit 20.

As illustrated in FIG. 2A, the plurality of radiation detecting units 20 is formed by being arrayed in the substantially arch shape, and the collimator 21 is arranged on the incident surface side of the radiation. As illustrated in FIG. 2B, the radiation detecting unit 20 has the radiation detector 30 fixed onto an element supporting plate 24. The radiation detector 30 includes a photoelectric conversion layer 31 provided with a plurality of photoelectric conversion elements 32 inside thereof and a scintillator 33 adapted to convert radiation to scintillation light. The photoelectric conversion layer 31 and the scintillator 33 have a stacking structure in which an incident surface side of the photoelectric conversion layer 31 is bonded to a light emission surface side of the scintillator 33 by a bonding layer.

The scintillator 33 includes light reflection plates 34 formed at a predetermined pitch in two directions intersecting with each other. The photoelectric conversion layer 31 and the scintillator 33 are defined into a plurality of photoelectric converters 35 arrayed in a matrix by the light reflection plates 34. A plurality of photoelectric conversion elements 32 is respectively included in the plurality of photoelectric converters 35, and detection of an event, detection of energy, and the like of the incident radiation are performed per the photoelectric converter 35.

The radiation such as the X-ray emitted from the radiation tube 11 (refer to FIG. 1) enters the scintillator 33 of the radiation detector 30. The radiation is converted by the scintillator 33 to the scintillation light including at least any one of ultraviolet, visible light, and infrared having a wavelength longer than the radiation as an electromagnetic wave. The converted scintillation light passes the scintillator 33 while being reflected by the light reflection plate 34, and is directed to the photoelectric conversion layer 31.

The scintillation light emitted from the scintillator 33 enters the plurality of photoelectric conversion elements 32 formed on the photoelectric conversion layer 31. The photoelectric conversion element 32 forms electrical connection in a direction from a cathode side to an anode side of the APD of the photoelectric conversion element 32 (reverse bias direction) due to avalanche breakdown caused by entrance of the scintillation light (photon).

The photoelectric conversion element 32 is applied with voltage to be the reverse bias by the signal processor 22 (refer to FIG. 1). At this point, since electrical connection in the reverse bias direction is made by entrance of the photon into the photoelectric conversion element 32 as described above, current flows in the photoelectric conversion element 32 (APD and a quench resistor connected in series thereto) in the reverse bias direction. Then, the current is detected by the signal processor 22 via the signal line 23.

Here, a value of the current flowing in the photoelectric conversion element 32 in the reverse bias direction is substantially not influenced by the number of incident photons (intensity of scintillation light). For example, in the case where one hundred of photons enter one photoelectric conversion element 32, ten out of one hundred photons enter each of ten photoelectric conversion elements 32 relative to the current value flowing in the one photoelectric conversion element 32, and a total value of the current flowing in the ten photoelectric conversion elements 32 becomes ten times. Therefore, in order to accurately detect intensity (current) of the radiation having entered the photoelectric converter 35 including the plurality of photoelectric conversion elements 32, the scintillation light is needed to uniformly enter the plurality of photoelectric conversion elements 32 inside the photoelectric converter 35. Thus, since the scintillation light having entered the photoelectric conversion layer 31 uniformly enter the plurality of photoelectric conversion elements 32, the intensity of the scintillation light, namely, the current value accurately reflected with intensity of the radiation having entered the radiation detector 30 can be detected in the photoelectric converter 35.

Figure 3:
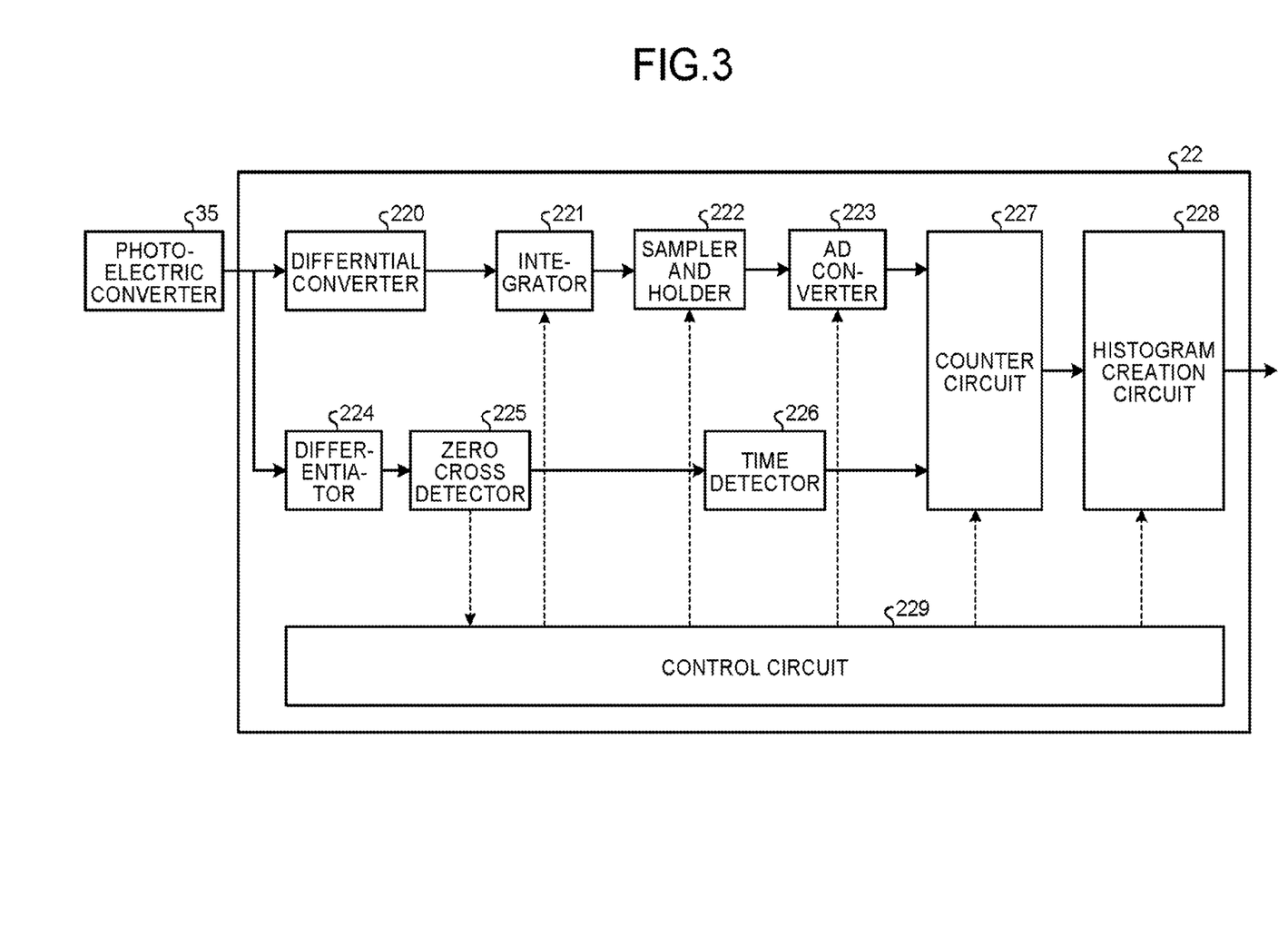
FIG. 3 is a diagram illustrating a circuit configuration of a signal processor.

FIG. 3 is a diagram illustrating a circuit configuration of the signal processor. A circuit block configuration of the signal processor 22 according to the present embodiment will be described with reference to FIG. 3.

As illustrated in FIG. 3, the signal processor 22 includes a differential converter 220, an integrator 221 (integration unit), a sampler and holder 222, an AD converter 223, a differentiator 224, a zero cross detector 225, a time detector 226 (which may be referred to as an event interval detector), a counter circuit 227 (which may be simply referred to as a counter), a histogram creation circuit 228 (which may be simply referred to as a creator), and a control circuit 229 (which may be referred to as a pile-up detector).

The differential converter 220 receives current I detected by the photoelectric converter 35 and reflected with the intensity of the radiation, converts the same to a differential signal in which noise resistance performance is improved, and transmits the differential signal of the current to the integrator 221.

The integrator 221 executes integration processing for the current received from the differential converter 220 and converted to the differential signal to calculate charge Q, and transmits the calculated charge Q to the sampler and holder 222. Specifically, the integrator 221 includes a capacitor inside thereof, and when the current flows into the capacitor, the current is accumulated as the charge Q. Therefore, a value output by the integrator 221 is to be a value of voltage at both ends of the capacitor and the value is proportional to the charge accumulated in the capacitor. However, since the charge is mathematically obtained by integrating the current, the following description will be provided assuming that the value output by the integrator 221 is the value of the charge. The integrator 221 starts integration processing at the timing of receiving the current from the differential converter 220 and at the timing of receiving a later-described pile-up detection signal from the control circuit 229. Furthermore, for example, the integrator 221 may perform discharge when the charge Q to be transmitted to the sampler and holder 222 and accumulated in the capacitor is sampled and held by the sampler and holder 222 or when the charge Q sampled and held by the sampler and holder 222 is applied with AD conversion by the AD converter 223 described later. Furthermore, the integrator 221 may receive the above-described pile-up detection signal during the integration processing performed by accumulating the charge Q in the capacitor or during discharge of the accumulated charge Q. In this case, for example, the integrator 221 includes a plurality of capacitors, and in the case of receiving the pile-up detection signal during the integration processing or during discharge in a certain capacitor, the integrator may perform the integration processing in a different capacitor for current based on a later-described pile-up waveform.

The sampler and holder 222 samples and holds the charge Q received from the integrator 221 as charge Q1 at the time of receiving a hold signal from the control circuit 229 as described later. Then, the sampler and holder 222 transmits the sampled and held charge Q1 to the AD converter 223. Meanwhile, timing when the control circuit 229 transmits the hold signal to the sampler and holder 222 will be described later. Furthermore, the sampler and holder 222 may cancel sampling and holding when AD conversion is applied to the sampled and held charge Q1 by the AD converter 223 as described later or when the hold signal received from the control circuit 229 becomes Low (OFF). Additionally, the sampler and holder 222 can perform sampling and holding, and can cancellation the same for each of the plurality of capacitors included in the integrator 221.

The AD converter 223 applies AD conversion to the charge Q1 received from the sampler and holder 222 in accordance with a predetermined clock frequency, and transmits a digital signal of the charge Q1 to the counter circuit 227. In other words, in the case where later-described pile-up does not occur, the clock frequency by the AD converter 223 is to be an upper limit value of a count rate up to which the number of times when the scintillation light enters the photoelectric converter 35, namely, the number of events can be counted. Meanwhile, the clock frequency may be based on a clock generated inside by the AD converter 223, and may also be based on a control signal transmitted from the control circuit 229. Furthermore, for example, a plurality of AD converters 223 having different clock frequencies may also be provided corresponding to the plurality of capacitors included in the sampler and holder 222. This can increase the upper limit value of the count rate up to which the above-described number of events can be counted.

The differentiator 224 receives the current I detected by the photoelectric converter 35 and reflected with the intensity of the radiation, calculates a differentiation value dI/dt by applying differential processing to the current I, and transmits a calculated differential value to the zero cross detector 225.

The zero cross detector 225 detects a zero cross of a differentiated waveform from a waveform of the differential value (differentiated waveform) received from the differentiator 224, and transmits zero cross information to the time detector 226 and the control circuit 229 at the time of detecting the zero cross. The zero cross information includes information of a zero cross when the differential value in the differentiated waveform becomes a positive value from a negative value (hereinafter referred to as rising zero cross) or a zero cross when the differential value becomes a negative value from a positive value (hereinafter referred to as falling zero cross). Also, the time when the zero cross is detected is the timing when inclination of a waveform of the current I becomes "zero". Among them, the time when the falling zero cross is detected corresponds to the timing when the waveform of the current I reaches a peak, and the time when the rising zero cross is detected corresponds to the timing when later-described pile-up occurs.

The time detector 226 detects, based on the zero cross information from the zero cross detector 225, a period from a peak to a peak of the waveform of the current I (later-described normal waveform or pile-up waveform illustrated in FIG. 7), namely, an event interval. For example, in the case of receiving falling zero cross information after receiving falling zero cross information, the time detector 226 detects the event interval from a peak of the normal waveform to a peak of a next normal waveform or an event interval from a peak of a pile-up waveform that has been piled up on the normal waveform to a peak of a next normal waveform. Furthermore, in the case of receiving falling zero cross information, rising zero cross information, and then falling zero cross information in this order, the time detector 226 determines and detects a period from timing of receiving the first falling zero cross information to timing of receiving the final falling zero cross information as an event interval as follows. More specifically, the period corresponds to an event interval from a peak of the normal waveform to a peak of the pile-up waveform that has been piled up on the normal waveform or an event interval from a peak of a pile-up waveform that has been piled up on the normal waveform (or pile-up waveform) to a peak of a pile-up waveform that is additionally piled up on the pile-up waveform. Then, the time detector 226 transmits the detected event interval to the counter circuit 227.

The counter circuit 227 receives information of the charge Q1 applied with AD conversion by the AD converter 223 and information of the event interval detected by the time detector 226. Meanwhile, in FIG. 7 described later, charge of the normal waveform is defined as Q1 and charge of the pile-up waveform is defined as Q2, but the charge Q1 here includes both. The counter circuit 227 counts the number of events (event number) in accordance with respective values of the received charge Q1 and the event interval. Here, as a method of counting the number of events, as for the event corresponding to the normal waveform, the number of events may be counted in the case of receiving the information of the charge Q1. Furthermore, as for the event corresponding to the pile-up waveform, counting may be executed in the case of receiving the information of the charge Q1 (in FIG. 7, indicated as charge Q2) or in the case of receiving, from the control circuit 229, a control signal indicating transmission of a pile-up detection signal when the pile-up detection signal is transmitted from the control circuit 229 to the integrator 221. Then, the counter circuit 227 transmits, to the histogram creation circuit 228, the information of the number of events corresponding to the respective values of the charge Q1 and the event interval.

The histogram creation circuit 228 creates a histogram for the charge Q1 and the number of events and a histogram for the event interval and the number of events based on information of the number of events corresponding to the respective values of the charge Q1 and the event interval received from the counter circuit 227. The histogram creation circuit 228 transmits the created histogram information to an external apparatus. Meanwhile, the histogram creation circuit 228 is not limited to creating both of the histogram for the charge Q1 and the number of events and the histogram for the event interval and the number of events, and may also create one of these histograms.

The control circuit 229 controls entire operation of the signal processor 22. Specifically, the control circuit 229 receives the zero cross information from the zero cross detector 225, and in the case where the zero cross information relates to a rising zero cross, the control circuit 229 detects occurrence of pile-up and transmits a pile-up detection signal to the integrator 221. Furthermore, in the case where the zero cross information is received from the zero cross detector 225 and the zero cross information relates to a falling zero cross, the control circuit 229 detects a fact that a waveform of the current I (normal waveform and pile-up waveform) has reached a peak, and transmits a hold signal to the sampler and holder 222. Meanwhile, it has been described that the control circuit 229 transmits the hold signal at the time of receiving the zero cross information including the information of the falling zero cross, but not limited thereto, the control circuit 229 may also transmit the hold signal after a predetermined period has passed from receipt of the zero cross information, for example. Additionally, the control circuit 229 transmits a control signal adapted to specify respective operation of the AD converter 223, counter circuit 227, and histogram creation circuit 228. For example, in the case of detecting occurrence of pile-up as described above, the control circuit 229 may also transmit a control signal indicating such detection to the counter circuit 227.

Meanwhile, FIG. 3 is a diagram illustrating the exemplary configuration of the circuit block of the signal processor 22, and not limited thereto, as far as functions of the above-described respective processors and respective circuits are provided, any configuration may be applied.

Figure 4:
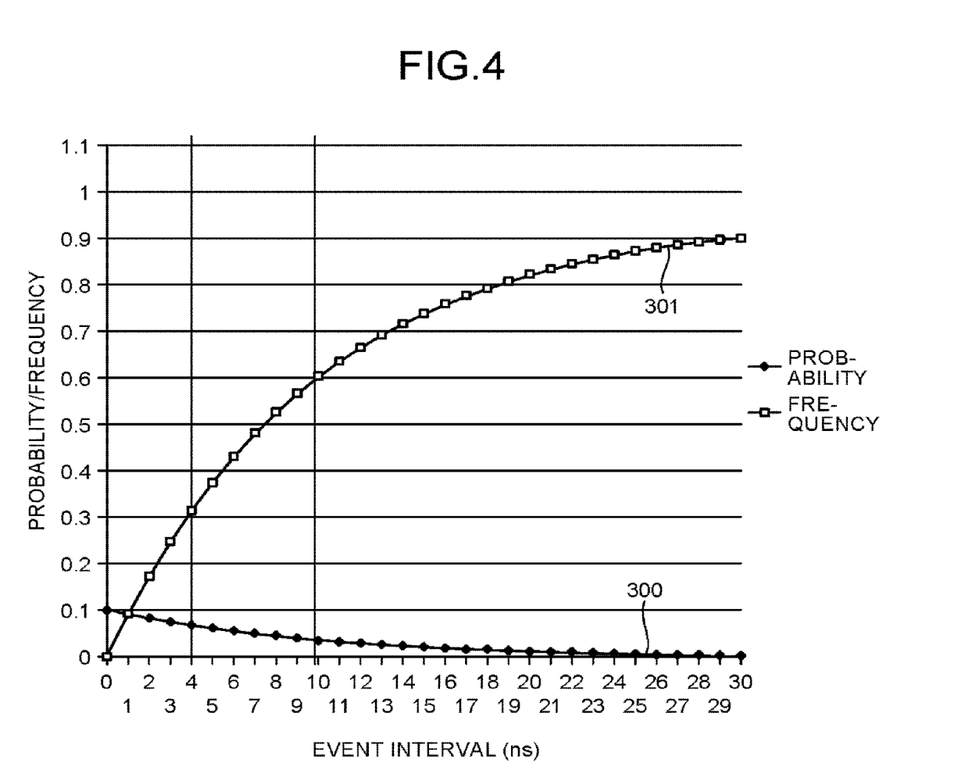
FIG. 4 is an explanatory diagram for Poisson distribution related to an arrival probability of radiation.

FIG. 4 is an explanatory diagram for Poisson distribution related to an arrival probability of radiation. The arrival probability of the radiation emitted from the radiation tube 11 and arriving at the photoelectric converter 35 of the radiation detecting unit 20, namely, a probability of event occurrence will be described with reference to FIG. 4.

The arrival probability of the radiation emitted from the radiation tube 11 and arriving at the photoelectric converter 35 (probability of event occurrence) is represented by, for example, probability distribution 300 in FIG. 4 basically in accordance with Poisson distribution as described above. The probability distribution 300 illustrated in FIG. 4 is a graph indicating an arrival probability of next radiation after a certain event interval upon arrival of the radiation. As described above, since the radiation arrives at the photoelectric converter 35 at a high arrival rate of about $10^8$ [cps], the longer the event interval is, the lower the probability is as illustrated in the probability distribution 300 of FIG. 4. Furthermore, since the probability distribution 300 is distribution of the probability, an entire graph of the probability distribution 300 is integrated, a value becomes "1" (area of the graph of the probability distribution 300).

Frequency distribution 301 illustrated in FIG. 4 is a graph indicating a probability of next radiation arriving within a certain event interval after arrival of the radiation. For example, in the frequency distribution 301, in the case where the event interval is 10 [ns], the probability of the next radiation arriving within this 10 [ns] is "0.6". Additionally, in the probability distribution 300, since the area of a portion between 0 and 10 [ns] indicates the probability of the next radiation arriving within 10 [ns] after arrival of the radiation, the value becomes "0.6".

Figure 5:
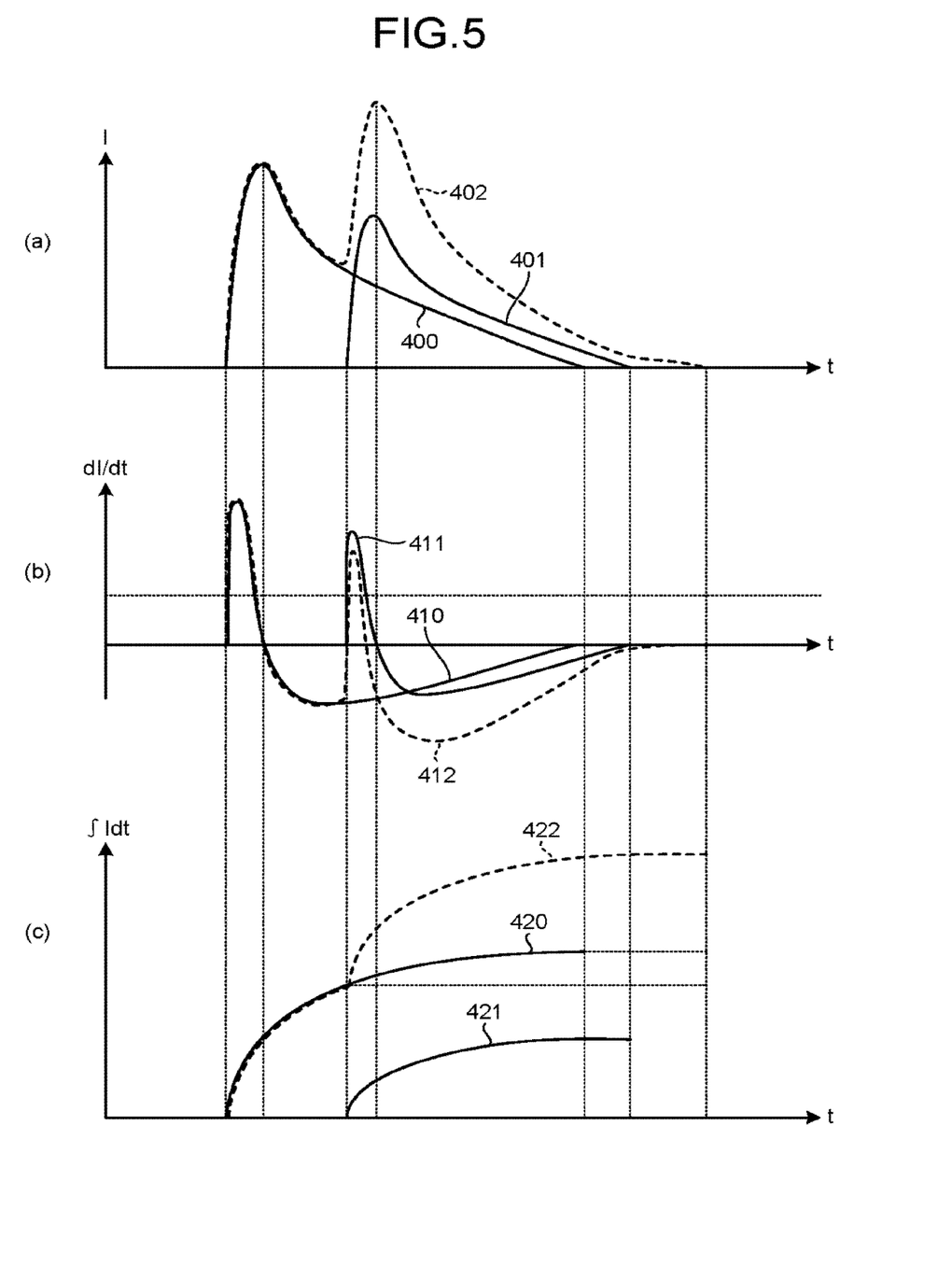
FIG. 5 is an explanatory diagram for a case where an interval between a normal waveform and a pile-up waveform is wide.
Figure 6:
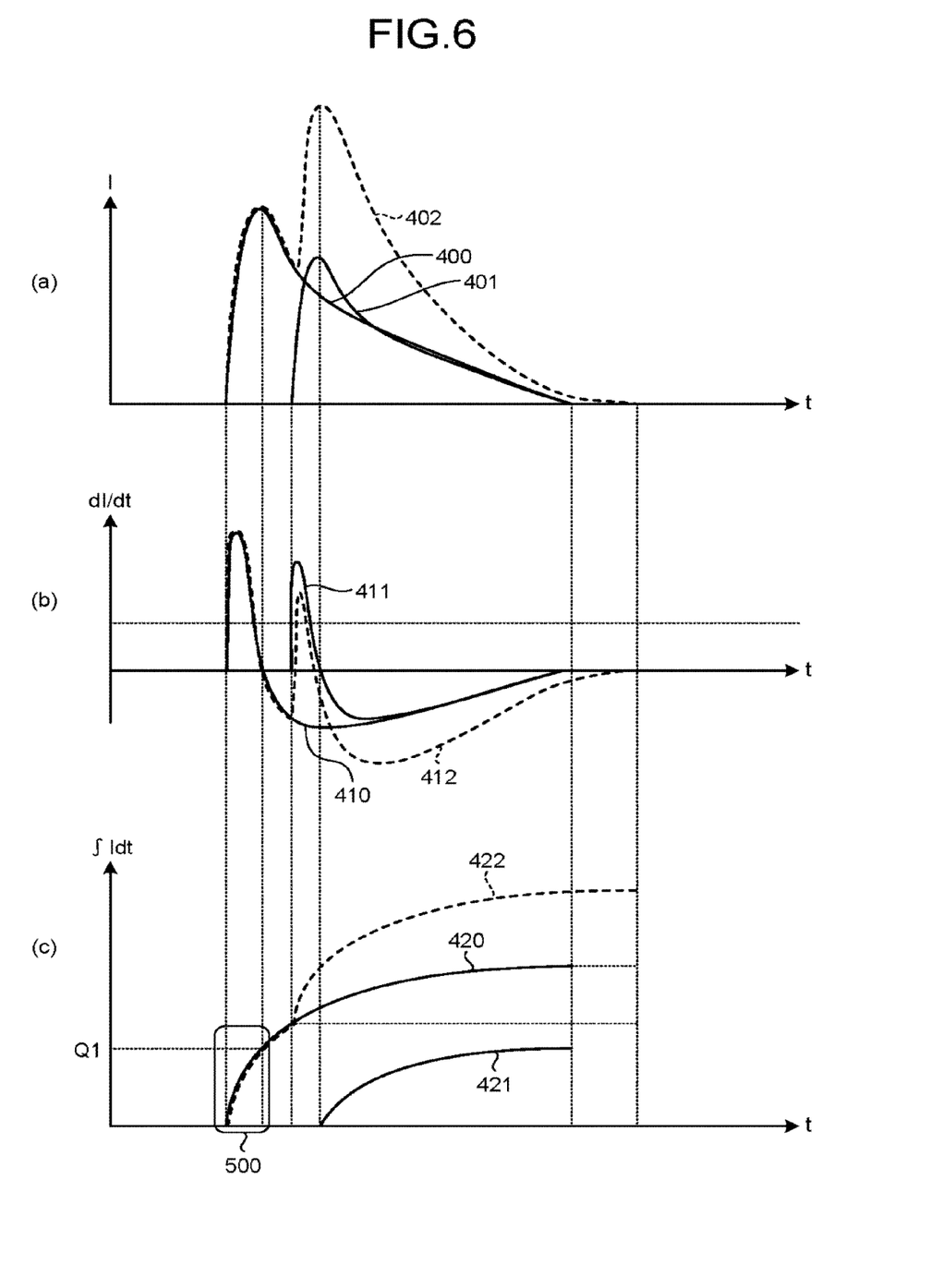
FIG. 6 is an explanatory diagram for a case where the interval between the normal waveform and the pile-up waveform is narrow.

FIG. 5 is an explanatory diagram for a case where an interval between a normal waveform and a pile-up waveform is wide. FIG. 6 is an explanatory diagram for a case where the interval between the normal waveform and the pile-up waveform is narrow. With reference to FIGS. 5 and 6, pile-up, integration operation by the integrator 221, and sampling and holding operation by the sampler and holder 222 will be described.

First, the pile-up and the integration operation by the integrator 221 will be described with reference to FIG. 5. When radiation from the radiation tube 11 enters the photoelectric converter 35 and a photon enters the APD of the photoelectric conversion element 32, current indicated by a normal waveform 400 of FIG. 5(a) flows. Since the photoelectric conversion element 32 has the quench resistor connected to the APD in series, the current indicated by the normal waveform 400 does not immediately becomes "zero" and a tail portion remains. As described above, since the arrival rate of the radiation is high, next radiation may arrive before the tail portion is sufficiently lowered. In this case, the current generated by the radiation arriving next is added to current generated by first radiation, and a signal higher than a signal of intrinsic current (normal waveform 401 of FIG. 5(a)) is generated. This is called pile-up. In FIG. 5(a), the normal waveform 401 based on the next radiation is piled up on the normal waveform 400 that is the waveform of the current based on the first radiation, and a waveform appearing as a signal having a height higher than a height of a signal of the intrinsic normal waveform 401 is indicated by a pile-up waveform 402.

FIG. 5(b) is a diagram of a waveform of a differential value dI/dt obtained by differentiating the current I illustrated in FIG. 5(a). In FIG. 5(b), a differentiated waveform 410 obtained by differentiating the normal waveform 400, a differentiated waveform 411 obtained by differentiating the normal waveform 401, and a pile-up differentiated waveform 412 obtained by differentiating the pile-up waveform 402 are illustrated. In these differentiated waveforms, when the differential value dI/dt becomes "zero" at the time of becoming from a positive value to a negative value, and when the differential value becomes "zero" at the time of becoming from a negative value to a positive value, the differential value becomes a zero cross at which inclination in the current waveform of FIG. 5(a) becomes "zero". Specifically, as illustrated in FIG. 5, timing when a falling zero cross is detected in the case where the differential value dI/dt is changed from the positive value to the negative value corresponds to the timing when a current waveform reaches a peak. Furthermore, timing when a rising zero cross is detected in the case where the differential value dI/dt is changed from the negative value to the positive value corresponds to the timing when pile-up occurs. As described above, when the falling zero cross or the rising zero cross is detected, the zero cross detector 225 transmits the zero cross information including such information to the time detector 226 and the control circuit 229.

FIG. 5(c) is a diagram illustrating an integration value obtained by integrating the current I illustrated in FIG. 5(a), namely, a waveform of the charge Q. In FIG. 5(c), a charge waveform 420 obtained by integrating the normal waveform 400, a charge waveform 421 obtained by integrating the normal waveform 401, and a pile-up charge waveform 422 obtained by integrating the pile-up waveform 402 are illustrated. The charge indicated by these charge waveforms is calculated by integration operation by the integrator 221. However, among the charge waveforms illustrated in FIG. 5(c), the charge waveform 421 indicates the waveform of the charge in the case where the normal waveform 401 is integrated, and since the normal waveform 401 is piled up on the normal waveform 400, the normal waveform 401 is not actually calculated by being integrated by the integrator 221.

Next, sampling and holding operation by the sampler and holder 222 will be described with reference to FIG. 6. FIG. 6(a) is a diagram illustrating an exemplary case where an interval between a peak of the normal waveform 400 and a peak of the normal waveform 401 (event interval) is narrower than the event interval illustrated in FIG. 5(a). FIG. 6(b) is a diagram illustrating a waveform of a differential value dI/dt obtained by differentiating the current I illustrated in FIG. 6(a). FIG. 6(c) is a diagram illustrating an integration value obtained by integrating the current I illustrated in FIG. 6(a), namely, a waveform of the charge Q.

First, the charge Q that is a result value of integrating current generated by an event is calculated by using the integrator 221 in order to acquire intensity of radiation having generated the event. However; the charge Q is hardly calculated by singularly integrating an entire current value of the normal waveform 400 because the normal waveform 401 is piled up on the normal waveform 400 as illustrated in FIGS. 5 and 6. Accordingly, the signal processor 22 according to the present embodiment executes operation to read an integration value (charge) of a waveform at a portion of the normal waveform 400 not influenced by the pile-up waveform 402, and deems a magnitude of this integration value as a value reflected with intensity of the radiation. Specifically, the control circuit 229 transmits a hold signal to the sampler and holder 222 at the time of receiving zero cross information related to a falling zero cross from the zero cross detector 225 or after a predetermined period has passed from receipt of the zero cross information related to the falling zero cross. Consequently, as illustrated in FIG. 6(c), the charge Q integrated by the integrator 221 at a portion of an integration region 500 of the normal waveform 400 not influenced by the pile-up waveform 402 is sampled and held in the charge Q1 by the sampler and holder 222. Then, the sampled and held charge Q1 is applied with AD conversion by the AD converter 223 in accordance with a predetermined clock frequency, and transmitted to the counter circuit 227 as a digital signal. The charge Q1 is the charge of the waveform at the portion of the normal waveform 400 not influenced by the pile-up waveform 402, and is regarded as the value reflected with intensity of the radiation.

Furthermore, as illustrated in FIG. 6(a), when the interval between the peak of the normal waveform 400 and the peak of the normal waveform 401 becomes narrow, a wave height at the peak of the pile-up waveform 402 becomes higher than a wave height of the pile-up waveform 402 illustrated in FIG. 5(a). In other words, when pile-up occurs, a wave height value of the peak of the pile-up waveform 402 depends on the interval between the normal waveform 400 and the normal waveform 401 (event interval). Therefore, it is difficult to directly calculate the charge Q obtained singularly by the normal waveform 401. Therefore, utilizing the fact that the wave height value of the peak of the pile-up waveform 402 depends on the event interval between the normal waveform 400 and the normal waveform 401, the counter circuit 227 estimates charge of the singular normal waveform 401, corresponding to the charge Q1 of the normal waveform 400 as described below. In other words, when the counter circuit 227 receives the control signal indicating the pile-up from the control circuit 229, the counter circuit 227 estimates the charge of the normal waveform 401 corresponding to the charge Q1 based on the charge Q1 obtained from the normal waveform 400 and the event interval between the normal waveform 400 and the pile-up waveform 402 (can also be referred to as the event interval between the normal waveform 400 and the normal waveform 401). The normal waveform 401 is an intrinsic current waveform in the case of assuming that the pile-up waveform 402 is not piled up.

Figure 7:
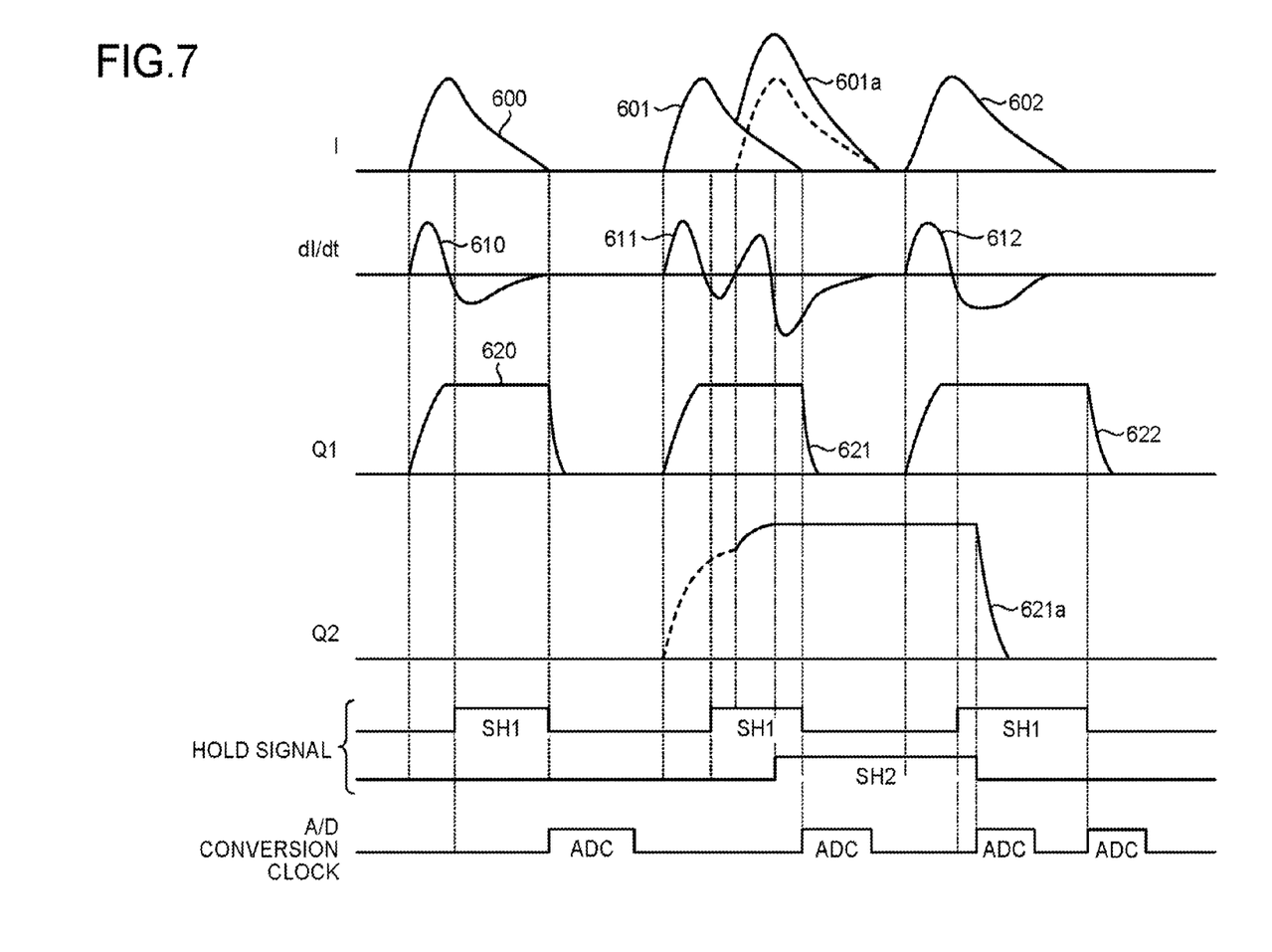
FIG. 7 is a timing chart from entrance of radiation to application of AD conversion.

FIG. 7 is a timing chart from entrance of radiation to application of AD conversion. Operation from when the radiation is made to enter the photoelectric converter 35 to when the sampled and held charge is applied with AD conversion will be described with reference to FIG. 7. In FIG. 7, first current indicated by a normal waveform 600 is generated by the radiation made to enter the photoelectric converter 35. Next, current indicated by a normal waveform 601 is generated by the radiation made to enter the photoelectric converter 35 subsequently. The radiation further enters the photoelectric converter 35 at timing in a table portion of this normal waveform 601, and current indicated by a pile-up waveform 601a piled up on the normal waveform 601 is generated. Furthermore, subsequently, current indicated by a normal waveform 602 is generated by the radiation made to enter the photoelectric converter 35. Meanwhile, wave height values of peaks of the normal waveforms 600 to 602 are illustrated to be the same heights in FIG. 7, but actually, the wave height values (intensity of radiation) are varied by the number of photoelectric conversion elements 32, where photons of the radiation enter, out of the plurality of photoelectric conversion element 32 of the photoelectric converter 35.

First, a description will be provided for a processing flow relative to the normal waveform 600 that is the waveform of the current generated by the radiation made to enter the photoelectric converter 35 and flowing in the photoelectric conversion element 32.

The differential converter 220 receives the current I detected by the photoelectric converter 35, reflected with intensity of the radiation, and indicated by the normal waveform 600, converts the current I to a differential signal, and transmits the differential signal to the integrator 221. The integrator 221 executes integration processing for the current (differential signal) received from the differential converter 220, calculates the charge Q indicated by a charge waveform 620, and transmits the calculated charge Q to the sampler and holder 222. The differentiator 224 receives the current I detected by the photoelectric converter 35, reflected with the intensity of the radiation, and indicated by the normal waveform 600, and calculates a differentiation value dI/dt by applying differential processing to the current I, and then transmits a calculated differential value to the zero cross detector 225. The zero cross detector 225 detects a falling zero cross from the differentiated waveform 610 that is the waveform of the differential value received from the differentiator 224, and transmits zero cross information to the time detector 226 and the control circuit 229 at the time of detecting the falling zero cross.

The control circuit 229 detects a fact that the normal waveform 600 of the current I has reached a peak by receiving the zero cross information related to the falling zero cross from the zero cross detector 225, and transmits a hold signal SH1 to the sampler and holder 222. Meanwhile, it has been described that the control circuit 229 transmits the hold signal SH1 at the time of receiving the zero cross information related to the falling zero cross, but not limited thereto, the control circuit 229 may also transmit the hold signal SH1 after a predetermined period has passed from receipt of the zero cross information, for example. The sampler and holder 222 samples and holds the charge Q received from the integrator 221 as charge Q1 at the time of receiving the hold signal SH1 from the control circuit 229. Then, the sampler and holder 222 transmits the sampled and held charge Q1 to the AD converter 223.

The AD converter 223 applies AD conversion to the charge Q1 received from the sampler and holder 222 in accordance with a clock signal ADC of a predetermined clock frequency, and transmits a digital signal of the charge Q1 to the counter circuit 227. Furthermore, the sampler and holder 222 may cancel sampling and holding when AD conversion is applied to the sampled and held charge Q1 by the AD converter 223 or when the hold signal SH1 received from the control circuit 229 becomes Low (OFF). Furthermore, the integrator 221 performs discharge when the accumulated charge Q is sampled and held by the sampler and holder 222 or when AD conversion is applied by the AD converter 223 to the charge Q1 sampled and held by the sampler and holder 222.

The time detector 226 detects an event interval from a peak of the normal waveform 600 to a peak of the normal waveform 601 of the current I based on the zero cross information related to the falling zero cross and later-described falling zero cross information relative to the normal waveform 601 received from the zero cross detector 225. Then, the time detector 226 transmits the detected event interval to the counter circuit 227. In the flow described above, the signal processor 22 executes the processing for the normal waveform 600 that is the waveform of the current generated by the radiation first made to enter the photoelectric converter 35 and flowing in the photoelectric conversion element 32.

Next, a description will be provided for a processing flow for the normal waveform 601 that is the waveform of the current generated by the radiation made to enter the photoelectric converter 35 after occurrence of an event related to the normal waveform 600 and flowing in the photoelectric conversion element 32, and the pile-up waveform 601a that is the waveform of the current generated by the radiation subsequently made to enter, flowing in the photoelectric conversion element 32, and piled up on the normal waveform 601.

The differential converter 220 receives the current I detected by the photoelectric converter 35, reflected with the intensity of the radiation, and indicated by the normal waveform 601, converts the current I to a differential signal, and transmits the differential signal to the integrator 221. The integrator 221 executes integration processing for the current (differential signal) received from the differential converter 220, calculates charge Q indicated by the charge waveform 621, and then transmits the calculated charge Q to the sampler and holder 222. The differentiator 224 receives the current I detected by the photoelectric converter 35, reflected with the intensity of the radiation, and indicated by the normal waveform 601, and calculates a differentiation value dI/dt by applying differential processing to the current I, and then transmits the calculated differential value to the zero cross detector 225. The zero cross detector 225 detects a falling zero cross from the differentiated waveform 611 that is the waveform of the differential value received from the differentiator 224, and transmits zero cross information to the time detector 226 and the control circuit 229 at the time of detecting the falling zero cross.

The control circuit 229 detects a fact that the normal waveform 601 of the current I has reached a peak by receiving the zero cross information related to the falling zero cross from the zero cross detector 225, and transmits a hold signal SH1 to the sampler and holder 222. Meanwhile, it has been described that the control circuit 229 transmits the hold signal SH1 at the time of receiving the zero cross information related to the falling zero cross, but not limited thereto, the control circuit 229 may also transmit the hold signal SH1 after a predetermined period has passed from receipt of the zero cross information, for example. The sampler and holder 222 samples and holds the charge Q received from the integrator 221 as charge Q1 at the time of receiving the hold signal SH1 from the control circuit 229. Then, the sampler and holder 222 transmits the sampled and held charge Q1 to the AD converter 223.

The time detector 226 detects an event interval from the peak of the normal waveform 600 to the peak of the normal waveform 601 of the current I based on the zero cross information related to the falling zero cross of the above described normal waveform 600 and the falling zero cross information of the normal waveform 601 received from the zero cross detector 225. Then, the time detector 226 transmits the detected event interval to the counter circuit 227.

The zero cross detector 225 further detects a rising zero cross from the differentiated waveform 611 that is the waveform of the differential value received from the differentiator 224, and transmits zero cross information to the time detector 226 and the control circuit 229 at the time of detecting the rising zero cross. The control circuit 229 detects occurrence of pile-up on the normal waveform 601 of the current I by receiving the zero cross information related to the rising zero cross from the zero cross detector 225, and transmits a pile-up detection signal to the integrator 221. The integrator 221 starts integration processing for the current received from the differential converter 220 and indicated by the pile-up waveform 601a at the timing of receiving the pile-up detection signal from the control circuit 229, calculates the charge Q indicated by a charge waveform 621a, and transmits the calculated charge Q to the sampler and holder 222. Here, since the integration processing has been executed by a specific capacitor for the current indicated by the normal waveform 601 at the time of starting the integration processing for the current indicated by the pile-up waveform 601a, the integrator 221 starts the integration processing by a capacitor different from the capacitor.

The zero cross detector 225 further detects a falling zero cross from the differentiated waveform 611 that is the waveform of the differential value received from the differentiator 224, and transmits zero cross information to the time detector 226 and the control circuit 229 at the time of detecting the falling zero cross. The control circuit 229 detects a fact that the pile-up waveform 601a of the current I has reached the peak by receiving the zero cross information related to the falling zero cross from the zero cross detector 225, and transmits a hold signal SH2 to the sampler and holder 222. Meanwhile, it has been described that the control circuit 229 transmits the hold signal SH2 at the time of receiving the zero cross information related to the falling zero cross, but not limited thereto, the control circuit 229 may also transmit the hold signal SH2 after a predetermined period has passed from receipt of the zero cross information, for example. The sampler and holder 222 samples and holds the charge Q received from the integrator 221 related to the pile-up waveform 601a as charge Q2 at the time of receiving the hold signal SH2 from the control circuit 229. Then, the sampler and holder 222 transmits the sampled and held charge Q2 to the AD converter 223.

The AD converter 223 applies AD conversion to the charge Q1 received from the sampler and holder 222 in accordance with a clock signal ADC of a predetermined clock frequency, applies AD conversion to the charge Q2 in accordance with a next clock signal ADC, and transmits digital signals of the charge Q1, Q2 to the counter circuit 227. Furthermore, the sampler and holder 222 may cancel sampling and holding when AD conversion is applied to the sampled and held charge Q1, Q2 by the AD converter 223 or when the hold signals SH1, SH2 received from the control circuit 229 become Low (OFF). Furthermore, the integrator 221 perform discharge when the accumulated charge Q is sampled and held by the sampler and holder 222 or when AD conversion is applied by the AD converter 223 to the charge Q1, Q2 sampled and held by the sampler and holder 222. Meanwhile, AD conversion for the charge Q1 obtained by integrating the current of the normal waveform 601 with the integrator 221 and being sampled and held by the sampler and holder 222. and AD conversion for the charge Q2 obtained by integrating the current of the pile-up waveform 601a by the integrator 221 and being sampled and held by the sampler and holder 222 may be applied by a plurality of AD converters 223 having different clock frequencies. In other words, AD conversion may be consecutively applied to the charge Q1 and charge Q2 by applying AD conversion to the charge Q1 and making the hold signal SH2 High (ON) until timing of next AD conversion having a different clock frequency.

The time detector 226 detects an event interval from the peak of the normal waveform 601 to a peak of the pile-up waveform 601a of the current I based on the zero cross information related to the falling zero cross of the above-described normal waveform 601 and the falling zero cross information of the pile-up waveform 601a received from the zero cross detector 225. Then, the time detector 226 transmits the detected event interval to the counter circuit 227. In the above-described flow, the signal processor 22 executes the processing for the normal waveform 601 and the pile-up waveform 601a piled up on the normal waveform 601.

Meanwhile, even in the case where pile-up further occurs on the pile-up waveform 601a, the operation is the same as described above.

Figure 8:
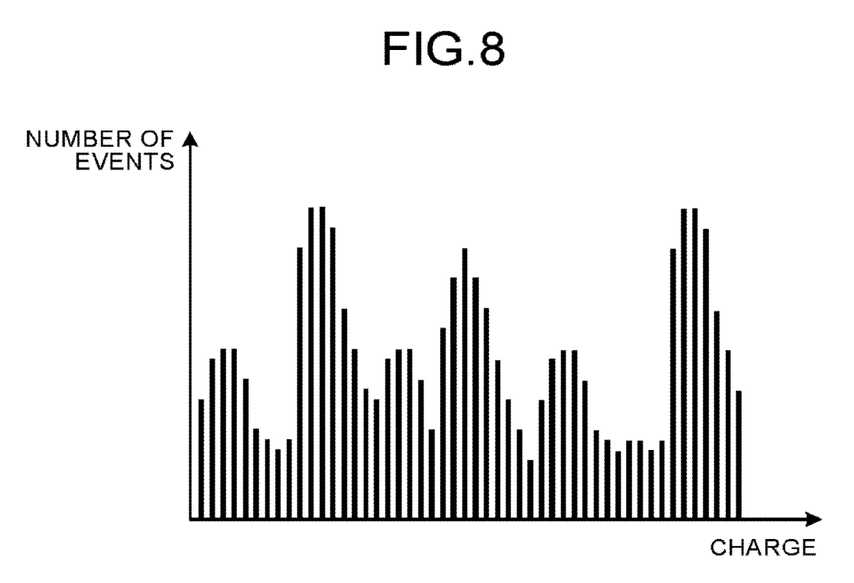
FIG. 8 is a diagram illustrating an exemplary histogram for charge and the number of events.
Figure 9:
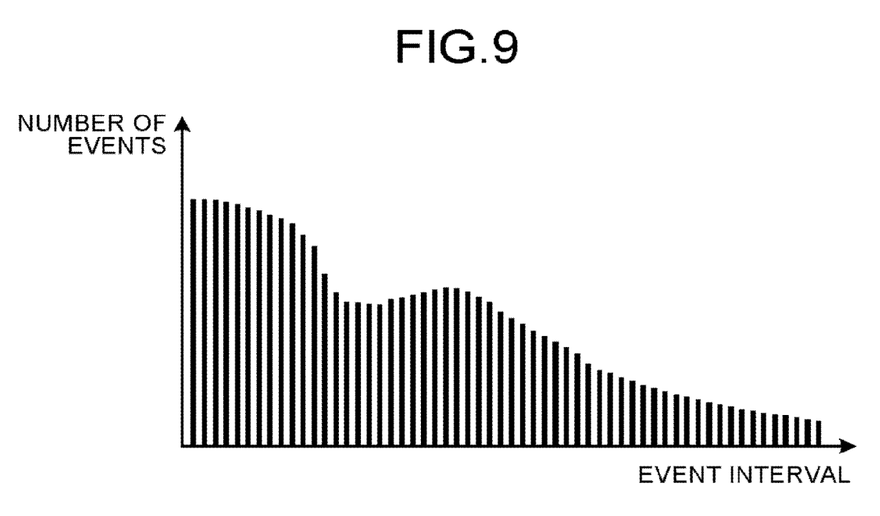
FIG. 9 is a diagram illustrating an exemplary histogram for an event interval and the number of events.

FIG. 8 is a diagram illustrating an exemplary histogram for the charge and the number of events. FIG. 9 is a diagram illustrating an exemplary histogram for the event interval and the number of events. Event counting operation by the counter circuit 227 and histogram creating operation by the histogram creation circuit 228 will be described with reference to FIGS. 8 and 9.

The counter circuit 227 receives information of the charge (charge Q1, Q2 in FIG. 7) applied with AD conversion by the AD converter 223 and information of the event interval detected by the time detector 226. The counter circuit 227 counts the number of events (event number) in accordance with respective values of the received charge Q1, Q2 and event interval. Here, as a method of counting the number of events, as for the event corresponding to the normal waveform, the number of events may be counted in the case of receiving the information of the charge Q1. Furthermore, as for the event corresponding to the pile-up waveform, counting may be executed in the case of receiving the information of the charge Q2 or in the case of receiving, from the control circuit 229, a control signal indicating transmission of a pile-up detection signal when the pile-up detection signal is transmitted from the control circuit 229 to the integrator 221.

Furthermore, since a wave height value of the peak of the pile-up waveform 601a is the value piled up on the normal waveform 601, the wave height is not the value not reflected with intensity of intrinsic radiation, different from the wave height value of the peak of the intrinsic normal waveform (waveform of the current I indicated by a dotted line in FIG. 7). Therefore, utilizing a fact that the wave height value of, for example, the peak of the pile-up waveform 601a in FIG. 7 depends on an event interval between the normal waveform 601 and the intrinsic normal waveform related to the pile-up waveform 601a (waveform of current I indicated by the dotted line in FIG. 7), the counter circuit 227 estimates charge obtained singularly by the waveform of the current I indicated by the dotted line in FIG. 7 and corresponding to the charge Q1 of the normal waveform 601. In other words, when the counter circuit 227 receives the control signal indicating pile-up from the control circuit 229, the counter circuit 227 estimates the charge of the intrinsic normal waveform corresponding to the charge Q1 based on the charge Q1 obtained from the normal waveform 601 and the event interval between the normal waveform 601 and the pile-up waveform 601a. The intrinsic normal waveform is the waveform in the case of assuming that the pile-up waveform 601a is not piled up. Then, the counter circuit 227 transmits, to the histogram creation circuit 228, the information of the number of events corresponding to the respective values of the charge and the event interval.

The histogram creation circuit 228 creates a histogram for the charge and the number of events and a histogram for the event interval and the number of events based on information of the number of events corresponding to the respective values of the charge and the event interval received from the counter circuit 227. By acquiring such histograms, it is possible to specify a substance constituting the test object 12 illustrated in FIG. 1 or recognize a composition and the like of a tissue. The exemplary histogram for the charge and the number of events is illustrated in FIG. 8, and the exemplary histogram for the event interval and the number of events is illustrated in FIG. 9. The histogram for the event interval and the number of events as illustrated in FIG. 9 shows the number of events (vertical axis) for respective event intervals (horizontal axis), and indicates the number of events at which the radiation arrives at the event interval, and further indicates probability distribution for the respective event intervals in accordance with increase of the number of events (number of samples). Therefore, the probability distribution should be the distribution having a shape similar to the probability distribution 300 in accordance with the above-described Poisson distribution illustrated in FIG. 4. Therefore, in the histogram creation circuit 228, an average value, a variance value, a mode value, and the like may be exemplified as characteristic values of the Poisson distribution (probability distribution 300) in which correction can be made on the created histogram for the event interval and the number of events based on the characteristic values of the Poisson distribution (probability distribution 300) illustrated in FIG. 4. Thus, it can be expected that a highly accurate histogram is obtained by correcting the histogram for the event interval and the number of events created by the histogram creation circuit 228 based on the characteristic values of the Poisson distribution.

As described above, occurrence of the event is counted by counting the number of charge of the normal waveform obtained by applying AD conversion in accordance with the clock signal of the clock frequency of the AD converter 223 and further detecting a fact that pile-up is detected. Consequently, the event of the radiation that arrives with the arrival rate higher than the clock frequency of the AD converter 223 can be detected with high accuracy. Furthermore, this enables creation of the histogram in which errors are reduced and accuracy is improved.

Additionally, as detection of the charge of the normal waveform, the control circuit 229 makes the sampler and holder 222 sample and hold the charge received from the integrator 221 at the time of receiving the zero cross information related to falling zero cross from the zero cross detector 225 or after the predetermined period has passed from receipt of the zero cross information related to the falling zero cross. Consequently, the value of the charge of the normal waveform having reduced influence from the pile-up waveform can be obtained as the value of the normal waveform reflected with intensity of the radiation that arrives at the photoelectric converter 35. Therefore, the histogram for the charge and the number of events, in which errors are reduced and accuracy is improved, can be created.

Furthermore, as an equivalent of the charge calculated for the normal waveform as described above, the charge of the pile-up waveform is estimated based on the charge calculated for the normal waveform and the event interval between the event related to the normal waveform and the event related to the pile-up waveform. Consequently, the charge equivalent to the charge calculated for the normal waveform can be accurately obtained as the value related to the pile-up waveform and reflected with the intensity of the radiation having arrived at the photoelectric converter 35. Accordingly, the histogram for the charge and the number of events, in which errors are reduced and accuracy is improved, can be created.

Furthermore, the histogram creation circuit 228 can make correction on the created histogram for the event interval and the number of events based on the characteristic values of the Poisson distribution. Consequently, the histogram for the event interval and the number of events, in which errors are reduced and accuracy is improved, can be created.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processor comprising:
   an integrator configured to calculate charge by integrating current from a photoelectric converter that converts to the current based on an incident radiation;
   a differentiator configured to calculate a differential value by differentiating the current;
   a zero cross detector configured to detect a zero cross of the differential value; and
   a controller configured to detect pile-up relative to the current based on the zero cross, wherein
   the integrator includes a plurality of capacitors, and
   if the controller detects pile-up when the current is being integrated using a capacitor of the capacitors, the integrator is configured to integrate using another capacitor of the capacitors the current corresponding to a pile-up waveform obtained by occurrence of the pile-up, and
   the signal processor further comprising a holder configured to hold an integration value of the current from when the current for a normal waveform, which is not the pile-up waveform obtained by occurrence of the pile-up on the current, is started to be integrated by the integrator to a time point within a predetermined time period that has passed from detection of a first zero cross of falling detected by the zero cross detector.

2. The signal processor according to claim 1, wherein the holder is configured to hold an integration value of the current corresponding to the pile-up waveform from when the current corresponding to the pile-up waveform is started to be integrated by the integrator to a time point within a predetermined time period that has passed from detection of a second zero cross of falling detected by the zero cross detector next to the first zero cross of falling.

3. A radiation detection device comprising:
   a signal processor according to claim 1;
   a scintillator configured to convert the radiation to scintillation light having a wavelength longer than a wavelength of the radiation;
   the photoelectric converter configured to convert the scintillation light to the current.

* * * * *